(12) United States Patent
Basker et al.

(10) Patent No.: US 10,147,679 B2
(45) Date of Patent: Dec. 4, 2018

(54) ELECTRICAL FUSE AND/OR RESISTOR STRUCTURES

(71) Applicant: INTERNATIONAL BUSINESS MACHINES CORPORATION, Armonk, NY (US)

(72) Inventors: Veeraraghavan S. Basker, Schenectady, NY (US); Kangguo Cheng, Schenectady, NY (US); Ali Khakifirooz, Los Altos, CA (US); Juntao Li, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/810,531

(22) Filed: Nov. 13, 2017

(65) Prior Publication Data

US 2018/0068948 A1    Mar. 8, 2018

Related U.S. Application Data

(63) Continuation of application No. 15/466,380, filed on Mar. 22, 2017, now Pat. No. 9,870,989, which is a
(Continued)

(51) Int. Cl.
*H01L 29/80* (2006.01)
*H01L 23/525* (2006.01)
(Continued)

(52) U.S. Cl.
CPC ....... *H01L 23/5256* (2013.01); *H01C 17/006* (2013.01); *H01H 69/022* (2013.01); *H01L 21/31051* (2013.01); *H01L 21/31116* (2013.01); *H01L 21/31144* (2013.01); *H01L 21/823437* (2013.01); *H01L 21/823475* (2013.01); *H01L 23/5228* (2013.01); *H01L 23/535* (2013.01); *H01L 23/5329* (2013.01); (Continued)

(58) Field of Classification Search
CPC .................. H01L 21/8234; H01L 23/5256
USPC .................................................. 257/257, 379
See application file for complete search history.

(56) References Cited

U.S. PATENT DOCUMENTS

| | | |
|---|---|---|
| 5,882,998 A | 3/1999 | Sur, Jr. et al. |
| 6,088,256 A | 7/2000 | Worley et al. |

(Continued)

OTHER PUBLICATIONS

"List of IBM Patents or Patent Applications Treated as Related" 1 page.
(Continued)

*Primary Examiner* — Jami V Miller
(74) *Attorney, Agent, or Firm* — Steven J. Meyers; Andrew M. Calderon; Roberts Mlotkowski Safran Cole & Calderon, P.C.

(57) ABSTRACT

Electrical fuse (eFuse) and resistor structures and methods of manufacture are provided. The method includes forming metal gates having a capping material on a top surface thereof. The method further includes protecting the metal gates and the capping material during an etching process which forms a recess in a dielectric material. The method further includes forming an insulator material and metal material within the recess. The method further includes forming a contact in direct electrical contact with the metal material.

14 Claims, 6 Drawing Sheets

Related U.S. Application Data continuation of application No. 14/826,628, filed on Aug. 14, 2015, now Pat. No. 9,716,064.

(51) Int. Cl.
| | |
|---|---|
| *H01L 23/522* | (2006.01) |
| *H01L 23/532* | (2006.01) |
| *H01L 49/02* | (2006.01) |
| *H01L 23/535* | (2006.01) |
| *H01L 21/3105* | (2006.01) |
| *H01L 21/311* | (2006.01) |
| *H01L 21/8234* | (2006.01) |
| *H01L 27/06* | (2006.01) |
| *H01C 17/00* | (2006.01) |
| *H01H 69/02* | (2006.01) |
| *H01L 29/49* | (2006.01) |
| *H01L 29/66* | (2006.01) |

(52) U.S. Cl.
CPC ...... *H01L 27/0617* (2013.01); *H01L 27/0629* (2013.01); *H01L 28/20* (2013.01); *H01L 29/495* (2013.01); *H01L 29/4966* (2013.01); *H01L 29/66545* (2013.01)

(56) References Cited

U.S. PATENT DOCUMENTS

| | | | |
|---|---|---|---|
| 6,258,700 B1 | 7/2001 | Bohr et al. | |
| 6,356,496 B1 | 3/2002 | Carroll et al. | |
| 6,927,472 B2 | 8/2005 | Anderson et al. | |
| 6,979,601 B2 | 12/2005 | Marr et al. | |
| 8,232,649 B2 | 7/2012 | Hsu et al. | |
| 9,312,185 B2 | 4/2016 | Tran et al. | |
| 9,515,155 B2 | 12/2016 | Boschke et al. | |
| 9,716,064 B2 | 7/2017 | Basker et al. | |
| 9,721,885 B2 | 8/2017 | Basker et al. | |
| 2002/0093112 A1* | 7/2002 | Nesbit | H01L 21/76897 257/211 |
| 2007/0120218 A1* | 5/2007 | Hsu | H01L 23/5256 257/529 |
| 2009/0051003 A1* | 2/2009 | Cheng | H01L 23/5256 257/529 |
| 2010/0301417 A1* | 12/2010 | Cheng | H01L 27/0629 257/355 |
| 2011/0241117 A1* | 10/2011 | Wei | H01L 23/5256 257/355 |
| 2012/0187523 A1 | 7/2012 | Cummings et al. | |
| 2012/0187528 A1* | 7/2012 | Cheng | H01L 23/5256 257/529 |
| 2017/0047286 A1 | 2/2017 | Basker et al. | |
| 2017/0047288 A1 | 2/2017 | Basker et al. | |
| 2017/0194251 A1 | 7/2017 | Basker et al. | |
| 2017/0221822 A1 | 8/2017 | Basker et al. | |

OTHER PUBLICATIONS

Specification "Electrical Fuse and/or Resistor Structures" and Drawings in U.S. Appl. No. 15/786,730, filed Oct. 18, 2017, 39 pages.
Specification "Electrical Fuse and/or Resistor Structures" and Drawings in U.S. Appl. No. 15/797,561, filed Oct. 30, 2017, 39 pages.
Specification "Electrical Fuse and/or Resistor Structures" and Drawings in U.S. Appl. No. 15/800,888, filed Nov. 1, 2017, 40 pages.
Notice of Allowance from U.S. Appl. No. 15/487,858 dated Dec. 1, 2017; 5 pages.
Notice of Allowance from U.S. Appl. No. 15/797,561 dated Mar. 7, 2018; 8 pages.
Office Action from U.S. Appl. No. 15/797,561 dated Dec. 15, 2017. 8 pages.
Office Action from U.S. Appl. No. 15/786,730 dated Sep. 26, 2018; 10 pages.
List of IBM Patents or Patent Applications Treated as Related, 2 pages.
Specification "Electrical Fuse and/or Resistor Structures" and Drawings in U.S. Appl. No. 16/132,922, filed Sep. 17, 2018; 26 pages.
Office Action from U.S. Appl. No. 15/800,888 dated Oct. 1, 2018; 8 pages.

\* cited by examiner

US 10,147,679 B2

ELECTRICAL FUSE AND/OR RESISTOR STRUCTURES

FIELD OF THE INVENTION

The invention relates to semiconductor structures and, more particularly, to electrical fuse (eFuse) and resistor structures and methods of manufacture.

BACKGROUND

Electrical fuses (eFuses)/metal resistors are essential for semiconductor applications such as system-on-chips (SoCs). However, conventional poly fuses/resistors are not feasible due to incompatibility with gate-last high-k/metal gate technology with self-aligned contacts. For example, in the process flow of forming the eFuses/metal resistors, nitride material formed on the top of metal gate material becomes damaged during the etching processes with selective chemistries.

SUMMARY

In an aspect of the invention, a method comprises: forming metal gates having a capping material on a top surface thereof; protecting the metal gates and the capping material during an etching process which forms a recess in a dielectric material; forming an insulator material and metal material within the recess; and forming a contact in direct electrical contact with the metal material.

In an aspect of the invention, a method comprises: forming metal gate structures in a dielectric material; forming a capping material over the metal gate structures; forming a mask over the capping material of the metal gate structures; recessing the dielectric material between the metal gate structures by an etching process while the mask over the capping material protects the capping material and the metal gate structures; depositing insulator material and metal material within the recess in the dielectric material; and forming a contact in direct electrical contact with the metal material.

In an aspect of the invention, a structure comprises: an efuse formed between replacement gate metals in a dielectric material, the replacement gate metals including a nitride capping material, the efuse is provided within a recess of the dielectric material, and the efuse comprises a nitride insulator material and a metal material which is in contact with a contact structure formed in an insulator material above the efuse.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to electrical fuse (eFuse) and resistor structures and methods of manufacture. More specifically, the present invention provides a method and structure for forming electrical fuses/resistors which are embedded in middle of the line (MOL) interlevel dielectric (ILD) layers. For example, in embodiments described herein, a thin metal layer between contacts can be used as fuse links/resistors. In embodiments, electrical contacts to the fuses/resistors are physically isolated from the fuses, with the electrical connection achieved through contacts, e.g., tungsten contacts, formed on top of the gate metal. The structures of the present invention also prevent diffusion of copper into the fuses/resistors thus improving reliability. Moreover, the fabrication processes described herein can be used post SAC (semi-aqueous chemistry) cap formation to form replacement metal gate (RMG) and eFuses. In additional embodiments, the methods for fabricating the eFuse and resistor structures are fully compatible with current CMOS integration processes.

The eFuse and resistor structures of the present invention can be manufactured in a number of ways using a number of different tools. In general, though, the methodologies and tools are used to form structures with dimensions in the micrometer and nanometer scale. The methodologies, i.e., technologies, employed to manufacture the eFuse and resistor structures of the present invention have been adopted from integrated circuit (IC) technology. For example, the structures of the present invention are built on wafers and are realized in films of material patterned by photolithographic processes on the top of a wafer. In particular, the fabrication of the eFuse and resistor structures of the present invention uses three basic building blocks: (i) deposition of thin films of material on a substrate, (ii) applying a patterned mask on top of the films by photolithographic imaging, and (iii) etching the films selectively to the mask.

Figure 1:
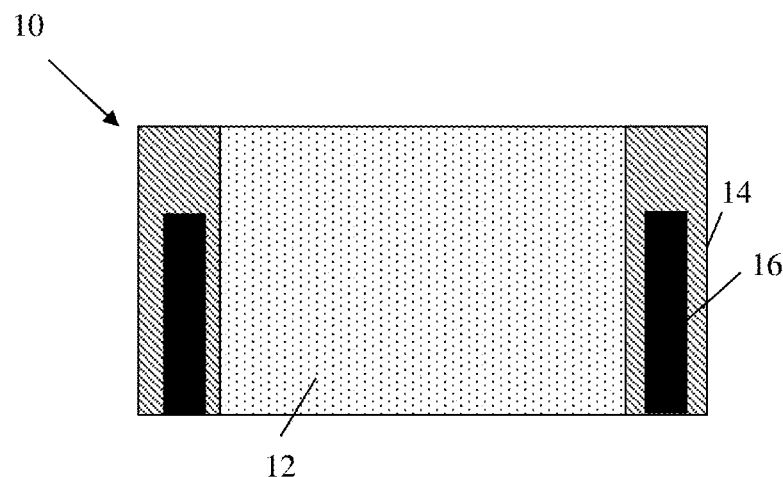
FIG. 1 shows a starting structure and respective fabrication processes according to aspects of the present invention.

FIG. 1 shows a structure and respective fabrication processes according to aspects of the present invention. In embodiments, the structure 10 includes a metal 16 (e.g., gate metal) with spacers and cap material 14 formed on sidewalls and a top of the gate metal 16. As should be understood by those of skill in the art, the gate metal 16 is formed in the active region of the structure 10. The gate metal 16 and spacers and cap material 14 are formed in an interlevel dielectric material 12 using conventional lithography, etching and deposition methods as should be understood by those of skill in the art such that further explanation is not required. In embodiments, the gate metal 16 can be TiN, tungsten or other gate metals known to those of skill in the art. The gate metal 16 can also be representative of a dummy or replacement gate metal. The spacers and cap 14 are preferably nitride material.

Figure 2:
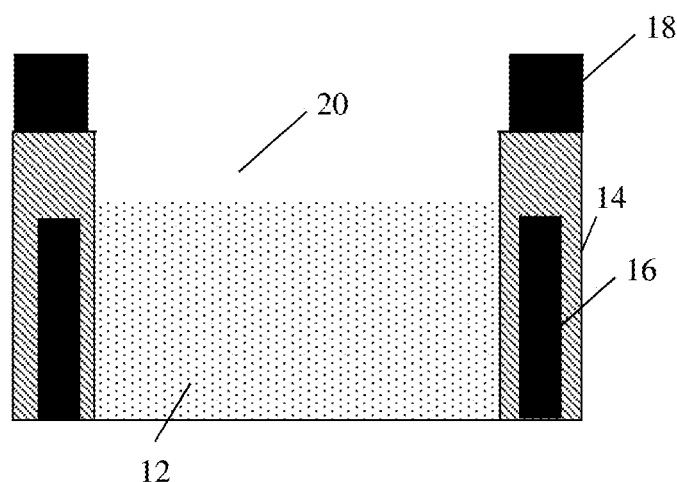
FIG. 2 shows a recessed portion in a dielectric material and respective fabrication processes according to aspects of the present invention.

As shown in FIG. 2, a recess 20 is formed in the interlevel dielectric material 12, e.g., between adjacent gate metals 16. In embodiments, the recess 20 is formed using lithography and etching processes. More specifically, a mask (photoresist) 18 is exposed to energy (light) to form a pattern masking the active region, e.g., gate metal 16. The interlevel dielectric material 12 is then subjected to an etching process, e.g., reactive ion etching (using SAC), to remove portions of the interlevel dielectric material 12. During this etching process, the gate metal 16 and cap material 14, e.g., nitride, remain protected by the mask 18 such that the cap material 14 will not be removed or eroded from a top of the gate metal 16 during the etching process. In this way, for example, a resistor module will not be affected by erosion caused by the SAC. In embodiments, the recess 20 can be about 15 nm to 80 nm deep, and more preferably about 35 nm to 40 nm deep.

Figure 3:
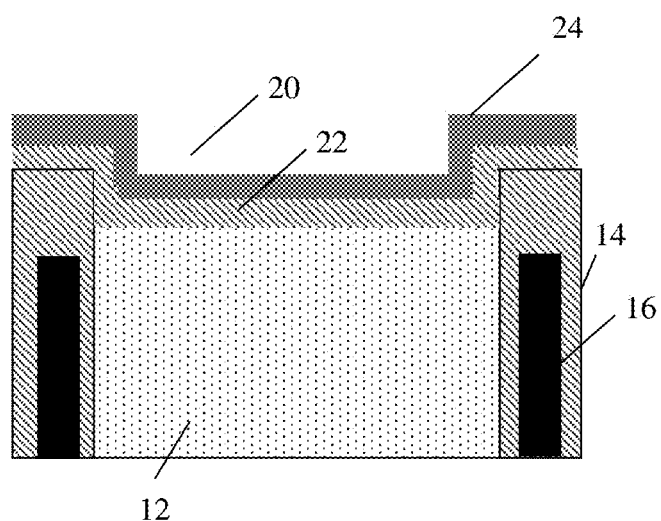
FIG. 3 shows materials in the recessed portion and respective fabrication processes according to aspects of the present invention.

As shown in FIG. 3, a nitride material 22 is deposited within the recess 20, followed by a metal material 24. In embodiments, an oxide material can be deposited on the metal material, as also shown by reference numeral 24. In embodiments, the metal material 24 can be, e.g., WSix; although other metals or metal alloys are also contemplated by the present invention. In embodiments, the nitride material 22 and metal material 24 can be deposited using conventional deposition processes, e.g., chemical vapor deposition (CVD) processes. The metal material 24 can be used to form an eFuse or resistor in accordance with any of the aspects of the present invention, depending on its thickness. For example, the metal material 24 can be deposited to a thickness of about 5 nm to 10 nm, and more preferably about 10 nm; although other dimensions are also contemplated by the present invention.

Figure 4:
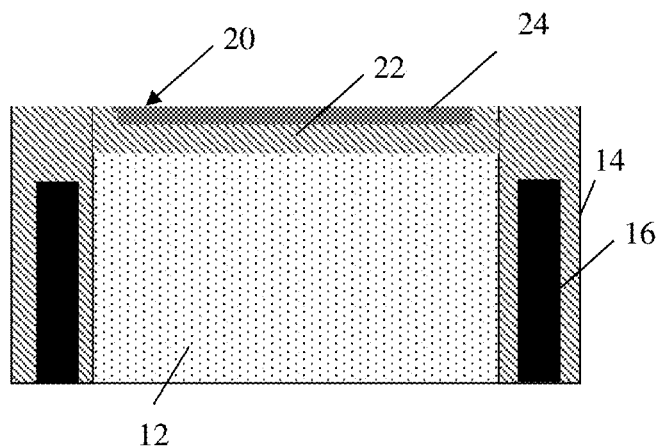
FIG. 4 shows a planar surface formed from the materials in the recessed portion and respective fabrication processes according to aspects of the present invention.

In FIG. 4, the nitride material 22 and metal material 24 undergo a polishing process to planarize these materials thus forming a planar surface. In embodiments, the polishing process can be, for example, a chemical mechanical polishing process. In this way, the nitride material 22 and metal material 24 remain within the recess 20, and any additional material is removed from the cap material 14. Also, the cap material 14 will remain intact above the gate metal 16.

Figure 5:
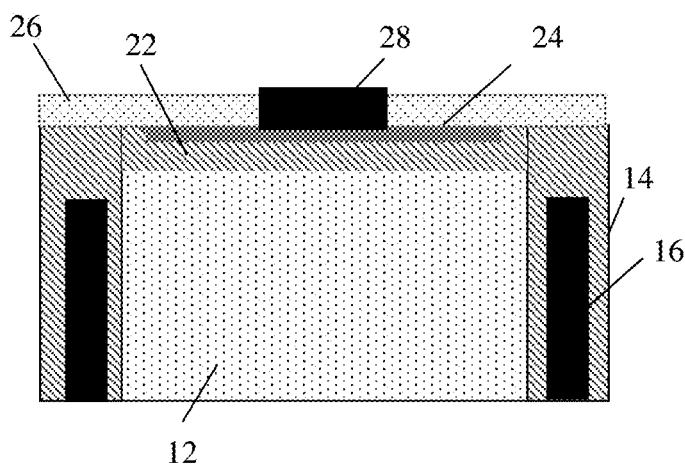
FIG. 5 shows a contact structure contacting a metal material and respective fabrication processes according to aspects of the present invention.

In FIG. 5, a contact structure 28 is formed in direct electrical contact with the metal material 24. In embodiments, the contact structure 28 is formed through an insulator material 26, e.g., oxide, using conventional lithography, etching and deposition processes. For example, after deposition of the insulator material 26, a mask (photoresist) can be deposited on the insulator material 26 and exposed to energy to form a pattern. An etching process, e.g., RIE, can then be performed through the pattern to form an opening in the insulator material 26 to expose the underlying metal material 24. A metal material or alloy thereof, e.g., tungsten, TiN, etc., can then be deposited within the opening to form the contact structure 28. Any residual material formed on the insulator material 26 can then removed by a CMP process.

Figure 6:
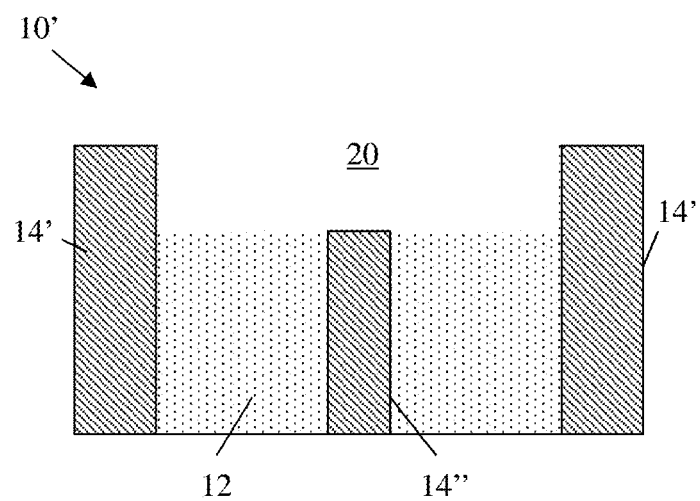
FIG. 6 shows a recessed portion in a dielectric material and respective fabrication processes according to another aspect of the present invention.

FIGS. 6-9 show an alternative structure and respective fabrication processes according to additional aspects of the present invention. Referring to FIG. 6, the structure 10' includes gate modules 14' and 14" (e.g., dummy gate material) formed in an interlevel dielectric material 12 using conventional lithography, etching and deposition methods as should be understood by those of skill in the art such that further explanation is not required. In embodiments, the gate modules 14' and 14" can be nitride material, e.g., TiN.

As further shown in FIG. 6, a recess 20 is formed in the interlevel dielectric material 12. In embodiments, the recess 20 is formed using lithography and etching processes. More specifically, a mask (photoresist) is exposed to energy (light) to form a pattern masking the active region, e.g., gate metal 16. The interlevel dielectric material 12 and the gate module 14" is then subjected to an etching process, e.g., RIE, to remove portions of the interlevel dielectric material 12 and the gate module 14". During this etching process, the gate modules 14', e.g., nitride, remain protected by the mask. In embodiments, the recess 20 can be about 15 nm to 80 nm deep, and more preferably about 35 nm to 40 nm deep.

Figure 7:
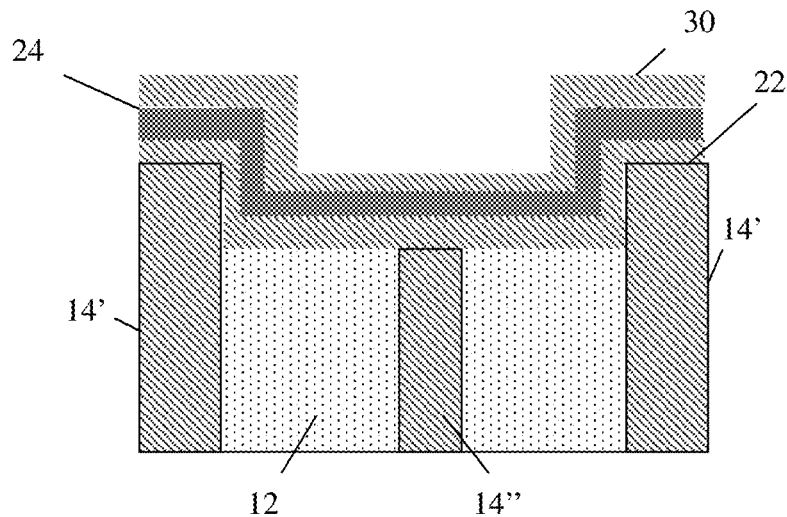
FIG. 7 shows materials in the recessed portion and respective fabrication processes according to the other aspect of the present invention.

As shown in FIG. 7, a nitride material 22 is deposited within the recess 20, followed by a metal material 24 and an insulator material 30, e.g., nitride material. In embodiments, the metal material 24 can be, e.g., WSix; although other metals or metal alloys are also contemplated by the present invention. In embodiments, the nitride material 22, metal material 24 and insulator material 30 can be deposited using conventional deposition processes, e.g., chemical vapor deposition (CVD) processes. The metal material 24 can be used to form an eFuse or resistor in accordance with aspects of the present invention, depending on its thickness. For example, the metal material 24 can be deposited to a thickness of about 5 nm to 10 nm, and more preferably about 10 nm; although other dimensions are also contemplated by the present invention.

Figure 8:
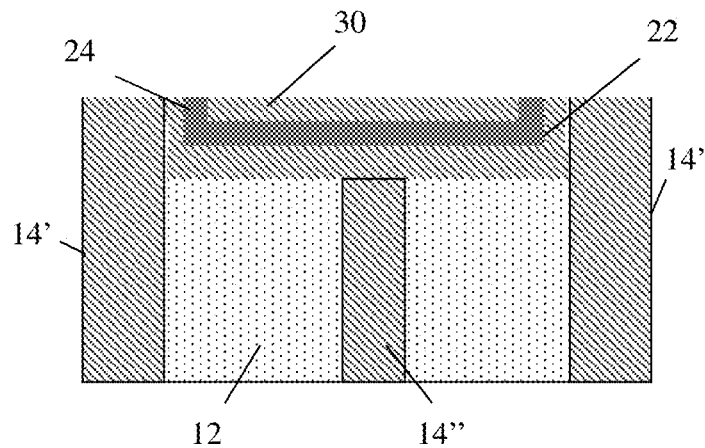
FIG. 8 shows a planar surface of the materials in the recessed portion and respective fabrication processes according to the other aspect of the present invention.

In FIG. 8, the nitride material 22, metal material 24 and insulator material 30 undergo a polishing process to planarize these materials thus forming a planar surface. In embodiments, the polishing process can be, for example, a CMP process. In this way, the nitride material 22, metal material 24 and insulator material 30 remain within the recess 20, and any additional material is removed from the gate modules 14'.

Figure 9:
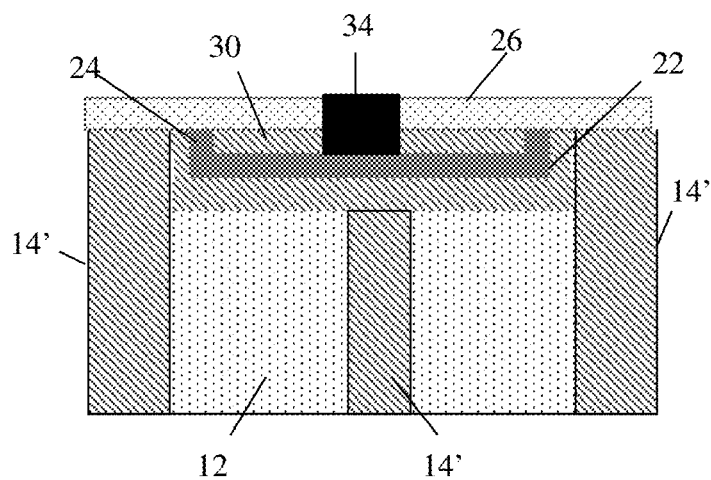
FIG. 9 shows a contact structure in contact with a metal material and respective fabrication processes according to the other aspect of the present invention.

In FIG. 9, a contact structure 34 is formed in direct electrical contact with the metal material 24. In embodiments, the contact structure 34 is formed through insulator material 26, e.g., oxide, using conventional lithography, etching and deposition processes. For example, after deposition of the insulator material 26, a mask (photoresist) can be deposited on the insulator material 26 and exposed to energy to form a pattern. An etching process, e.g., RIE, can then be performed through the pattern to form an opening in the insulator material 26 to expose the underlying metal material 24. A metal material or metal alloy, e.g., tungsten, TiN, etc., can be deposited within the opening to form the contact structure 28. Any residual material formed on the insulator material 26 can then removed by a CMP process.

Figure 10:
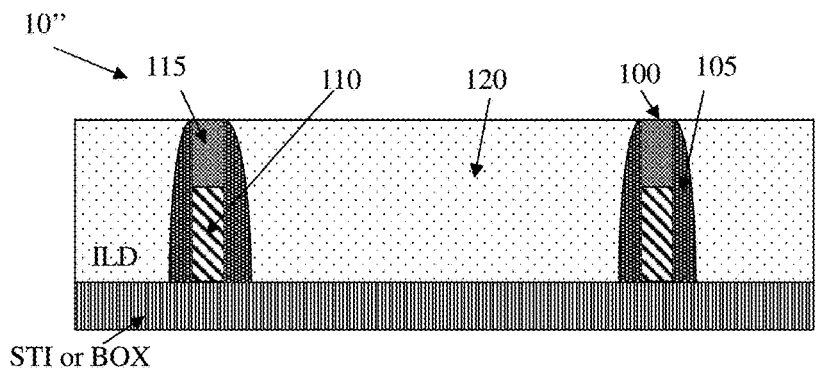
FIG. 10 shows a beginning structure and respective fabrication processes according to yet another aspect of the present invention.

FIGS. 10-15 show an alternative structure and respective fabrication processes according to additional aspects of the present invention. Referring to FIG. 10, the structure 10″ includes a post CMP structure having a gate structure 100 formed in an interlevel dielectric material 120 (formed on an insulator material, e.g., STI or BOX) using conventional lithography, etching and deposition methods as should be understood by those of skill in the art such that further explanation is not required. In embodiments, the gate structure 100 includes spacers 105 formed on a gate metal 110 and a capping material 115, e.g., nitride material.

Figure 11:
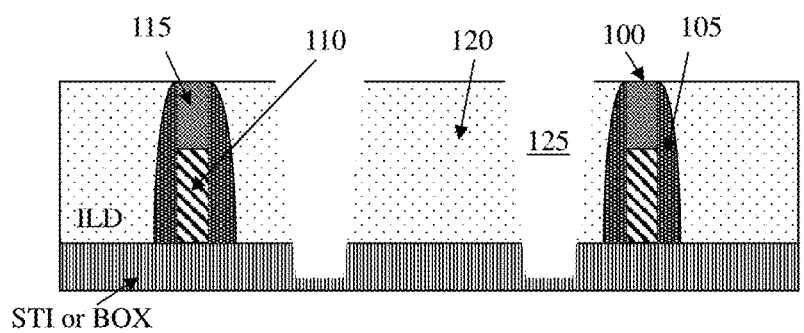
FIG. 11 shows contact trenches in a dielectric material between gate structures and respective fabrication processes according to yet another aspect of the present invention.

As shown in FIG. 11, contact trenches 125 are formed in the interlevel dielectric material 120, between the gate structures 100. In embodiments, the contact trenches 125 are formed using lithography and etching processes. More specifically, a mask (photoresist) 18 is exposed to energy (light) to form a pattern masking the active region, e.g., gate structures 100. The interlevel dielectric material 120 is then subjected to an etching process, e.g., RIE, to remove portions of the interlevel dielectric material 120. During this etching process, the gate structures 100, e.g., nitride, remain protected by the mask.

Figure 12:
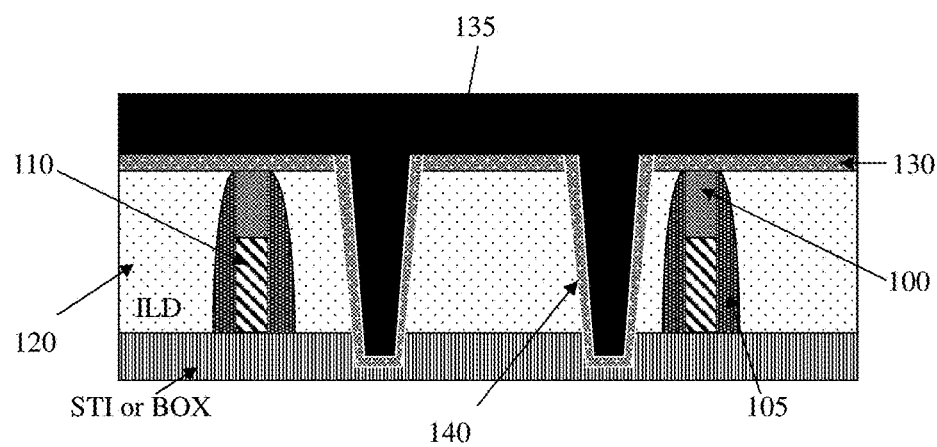
FIG. 12 shows metal contacts formed in the contact trenches and respective fabrication processes according to yet another aspect of the present invention.

As shown in FIG. 12, a liner material 130 is deposited within the contact trenches 125, followed by a metal material 135. The combination of the liner material 130 and the metal material 135 will form contacts 140. In embodiments, the metal material 135 can be, e.g., WSix; although other metal or metal alloys are contemplated by the present invention. In embodiments, the liner material 130 can be Ti or TiN or combinations thereof. The metal material 135 and liner material 130 can be deposited using conventional deposition processes, e.g., chemical vapor deposition (CVD) processes.

Figure 13:
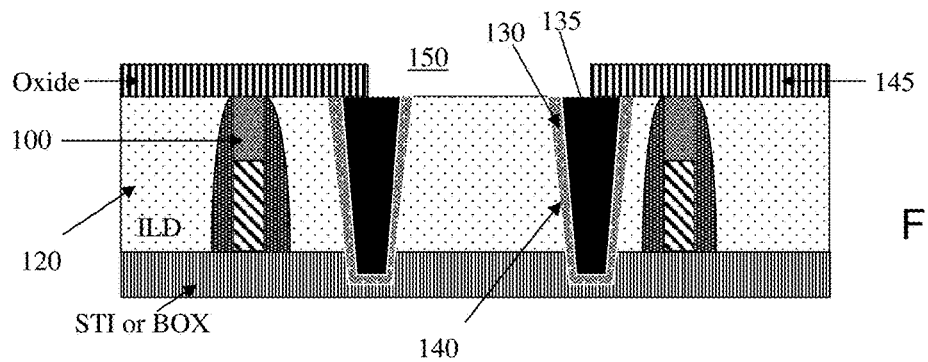
FIG. 13 shows an opening formed in insulator material to expose the metal contacts and respective fabrication processes according to yet another aspect of the present invention.

In FIG. 13, any residual metal material 135 and liner material 130 on the interlevel dielectric material 120 can be removed using a conventional CMP process. Another insulator material 145, e.g., oxide, can be formed on the planarized surface, e.g., metal material 135, liner material 130, gate structure 100 and exposed portions of the interlevel dielectric material 120. An opening 150 is formed in the insulator material 145, partly exposing the contacts 140. The opening 150 is formed using conventional lithography and etching processes.

Figure 14:
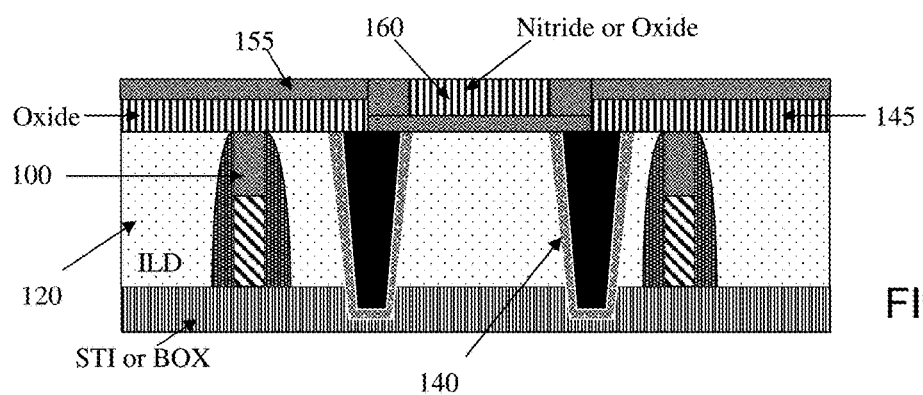
FIG. 14 shows materials in the opening of the insulator material and respective fabrication processes according to yet another aspect of the present invention.

In FIG. 14, a metal material 155, e.g., WSix, is deposited in the opening 150 and in contact with the contacts 140. The metal material 155 will also be deposited on the insulator material 145. An insulator material 160 is deposited within the opening 150 and on the metal material 155. In embodiments, the insulator material 160 can be nitride or oxide; although other insulator materials are also contemplated by the present invention. Any residual insulator material 160 formed on the metal material 155, outside the opening 150, can be removed by a CMP process, with the metal material 155 acting as an etch stop.

Figure 15:
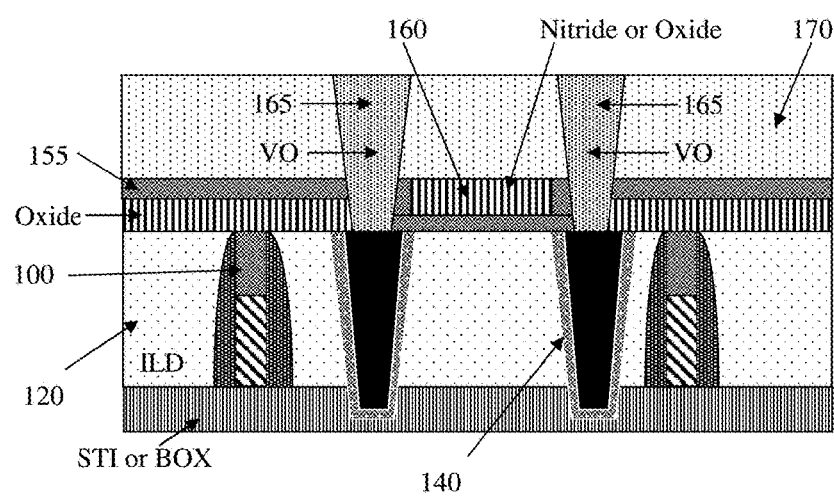
FIG. 15 shows contact structures in contact with the metal contacts and respective fabrication processes according to yet another aspect of the present invention.

As shown in FIG. 15, contacts 165 are formed in direct electrical contact with the contacts 140, through insulator material 170. In embodiments, the contacts 165 are formed through the insulator material 170, e.g., oxide, using conventional lithography, etching and deposition processes. For example, after deposition of the insulator material 170, a mask (photoresist) can be deposited on the insulator material 170 and exposed to energy to form a pattern. An etching process, e.g., RIE, can be performed through the pattern to form an opening in the insulator material 170 to expose the metal material of the contacts 140. A metal material, e.g., tungsten, TiN, etc., can be deposited within the opening to form the contacts 165. Any residual material formed on the insulator material 170 can then removed by a CMP process. In this way, contacts 170 are formed off of the same plane of the fuse or resistor.

Figure 16:
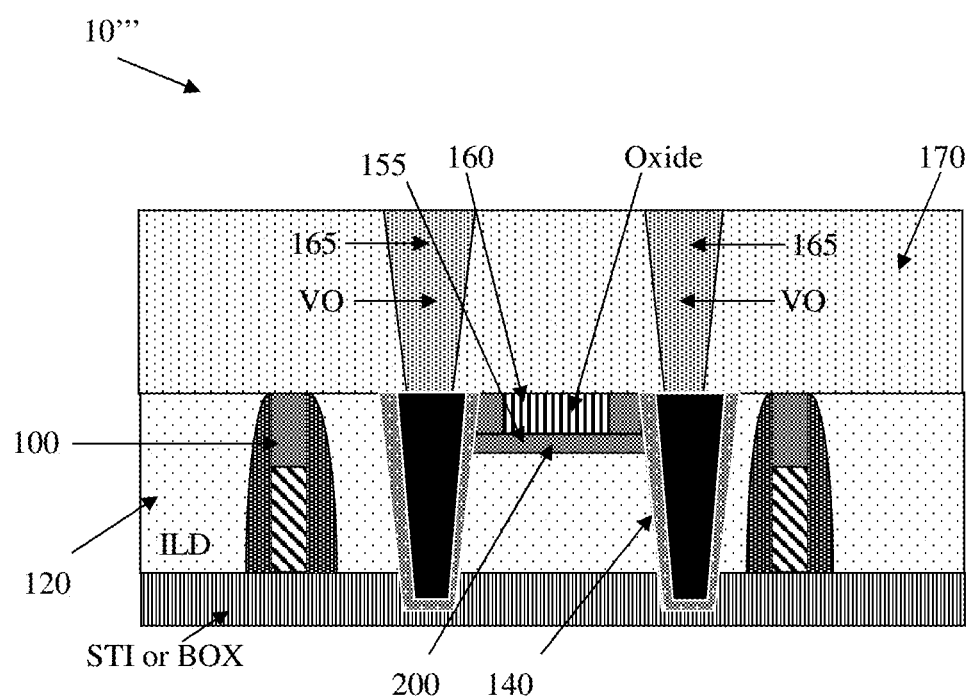
FIG. 16 shows an alternative structure and respective fabrication processes according to still yet another aspect of the present invention.

FIG. 16 shows an alternative structure and respective fabrication processes according to additional aspects of the present invention. Referring to FIG. 16, the structure 10′″ includes a post CMP structure having a gate structure 100 formed in an interlevel dielectric material 120 (formed on an insulator material, e.g., STI or BOX) using conventional lithography, etching and deposition methods as should be understood by those of skill in the art such that further explanation is not required. In embodiments, the gate structure 100 includes spacers 105 formed on a gate metal 110 and a capping material 115, e.g., nitride material.

As previously described, contacts 140 are formed in contact trenches formed in the interlevel dielectric material 120, between the gate structures 100. In embodiments, the contact trenches are formed using lithography and etching processes as previously described. The contacts 140 can include, e.g., a liner material and metal material deposited using conventional deposition processes, e.g., CVD processes. In embodiments, the metal material can be, e.g., WSix, and the liner material 130 can be Ti or TiN or combinations thereof. Any residual metal material and liner material on the interlevel dielectric material 120 can be removed using a conventional CMP process.

In comparison to FIG. 13, for example, a recess 200 is formed directly in the interlevel dielectric material 120 between the contacts 140. The recess 200 is formed using conventional lithography and etching processes. A metal material 155, e.g., WSix, is deposited in the recess 200 and in contact with the contacts 140. The metal material 155 will also be deposited on the insulator material 145. An insulator material 160 is deposited within the recess 200 and on the metal material 155. In embodiments, the insulator material 160 can be nitride or oxide; although other insulator materials are also contemplated by the present invention. Any residual insulator material 160 and metal material 155 formed outside the recess 200 can be removed by a CMP process stopping on the insulator material 120 thus forming a dielectric cap with the insulator material 160.

Still referring to FIG. 16, contacts 165 are formed in direct electrical contact with the contacts 140, through insulator material 170. In embodiments, the contacts 165 are formed through the insulator material 170, e.g., oxide, using conventional lithography, etching and deposition processes. For example, after deposition of the insulator material 170, a mask (photoresist) can be deposited on the insulator material 170 and exposed to energy to form a pattern. An etching process, e.g., RIE, can then be performed through the pattern to form an opening in the insulator material 170 to expose the metal material of the contacts 140. A metal material, e.g., tungsten, TiN, etc., can then be deposited within the opening to form the contacts 165. Any residual material formed on the insulator material 170 can then removed by a CMP process. In this way, contacts 170 are formed off of the same plane of the fuse or resistor.

In alternative aspects of the invention, a structure comprises: an efuse formed above the contacts and the replacement gate structures in a dielectric material, the replacement gate metals including a nitride capping material, the efuse is provided within a recess of the dielectric material, and the efuse comprises a nitride insulator material and a metal material which is in contact with a contact structure formed in an insulator material above the efuse. In an additional aspects of the invention, a structure comprises: an efuse formed between contacts and the replacement gate structures in a dielectric material, the replacement gate metals including a nitride capping material, the efuse is provided within a recess of the dielectric material, and the efuse comprises a nitride insulator material and a metal material which is in contact with a contact structure formed in an insulator material above the efuse.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
    forming metal gates having a capping material on a top surface thereof;
    protecting the metal gates and the capping material during an etching process which forms recesses in a dielectric material;
    forming contact structures in the recesses in the dielectric material between the metal gates;
    forming an opening in the dielectric material, wherein the opening is formed between the contact structures;
    forming an insulator material and metal material within the opening;
    wherein the opening is first filled with the metal material followed by the insulator.

2. The method of claim 1, further comprising removing excess of the insulator material formed on the metal material outside the opening.

3. A method comprising:
    forming metal gate structures in a dielectric material;
    forming a capping material over the metal gate structures;
    forming a mask over the capping material of the metal gate structures;
    forming recesses in the dielectric material between the metal gate structures by an etching process while the mask over the capping material protects the capping material and the metal gate structures;
    forming contact structures in the recesses in the dielectric material between the metal gate structures;
    forming an opening in the dielectric material, wherein the opening is formed between the contact structures;
    depositing insulator material and metal material within the opening;
    wherein the opening is first filled with the metal material followed by the insulator material.

4. The method of claim 3, further comprising removing excess of the insulator material formed on the metal material outside the opening.

5. The method of claim 3, wherein the contact structures each comprise a liner formed in one of the recesses in the dielectric material.

6. The method of claim 5, wherein the metal material contacts the liner of each of the contact structures.

7. The method of claim 3, further comprising planarizing top surfaces of the dielectric layer, the capping material, the contact structures, the insulator material, and the metal material.

8. The method of claim 3, further comprising:
    forming another dielectric layer over the dielectric layer, the capping material, the contact structures, the insulator material, and the metal material; and
    forming additional contacts in the other dielectric layer.

9. The method of claim 8, wherein the additional contacts contact the contact structures, respectively.

10. The method of claim 1, wherein the contact structures each comprise a liner formed in one of the recesses in the dielectric material.

11. The method of claim 10, wherein the metal material contacts the liner of each of the contact structures.

12. The method of claim 1, further comprising planarizing top surfaces of the dielectric layer, the capping material, the contact structures, the insulator material, and the metal material.

13. The method of claim 1, further comprising:
    forming another dielectric layer over the dielectric layer, the capping material, the contact structures, the insulator material, and the metal material; and
    forming additional contacts in the other dielectric layer.

14. The method of claim 13, wherein the additional contacts contact the contact structures, respectively.

* * * * *